United States Patent [19]

Horiike et al.

[11] Patent Number: 5,290,609
[45] Date of Patent: Mar. 1, 1994

[54] METHOD OF FORMING DIELECTRIC FILM FOR SEMICONDUCTOR DEVICES

[75] Inventors: Yasuhiro Horiike, Hiroshima; Kohei Kawamura, Tokyo, both of Japan

[73] Assignees: Tokyo Electron Limited, Tokyo; Yasuhiro Horiike, Hiroshima, both of Japan

[21] Appl. No.: 848,019

[22] Filed: Mar. 9, 1992

[30] Foreign Application Priority Data

Mar. 25, 1991 [JP] Japan .................................... 3-82985

[51] Int. Cl.⁵ .............................................. B05D 3/06
[52] U.S. Cl. .................................... 427/576; 427/564; 427/81; 427/255; 427/255.1; 427/343; 427/377; 427/232; 427/235; 427/249
[58] Field of Search ................. 427/564, 576, 573, 81, 427/255.1, 255.3, 255, 343; 437/232, 235, 249

[56] References Cited

U.S. PATENT DOCUMENTS

| | | | |
|---|---|---|---|
| 4,217,374 | 8/1980 | Ovshinsky et al. | 427/573 |
| 4,775,549 | 10/1988 | Ota et al. | 427/81 |
| 4,883,686 | 11/1989 | Doehler et al. | 427/573 |

*Primary Examiner*—Janyce Bell
*Attorney, Agent, or Firm*—Oblon, Spivak, McClelland, Maier & Neustadt

[57] ABSTRACT

A dielectric film of a capacitor is formed using the plasma CVD apparatus. A thin Ta layer is deposited on a semiconductor wafer by using $Ta(N(CH_3)_2)_5$ gas and $H_2$ radicals. The thin Ta layer is then oxidized by $O_2$ radicals to form a thin $Ta_2O_5$ layer. An $Si_3N_4$ layer is then formed on the $Ta_2O_5$ layer by using $SiH_4$ and $NH_3$ gases. The $Ta_2O_5$ layer and the $Si_3N_4$ layer are alternately laminated one upon the other several times to form a dielectric film of laminated structure. The dielectric film can thus have a composition close to the stoichiometric composition and it can be made high in dielectric constant and excellent in withstand voltage.

12 Claims, 5 Drawing Sheets

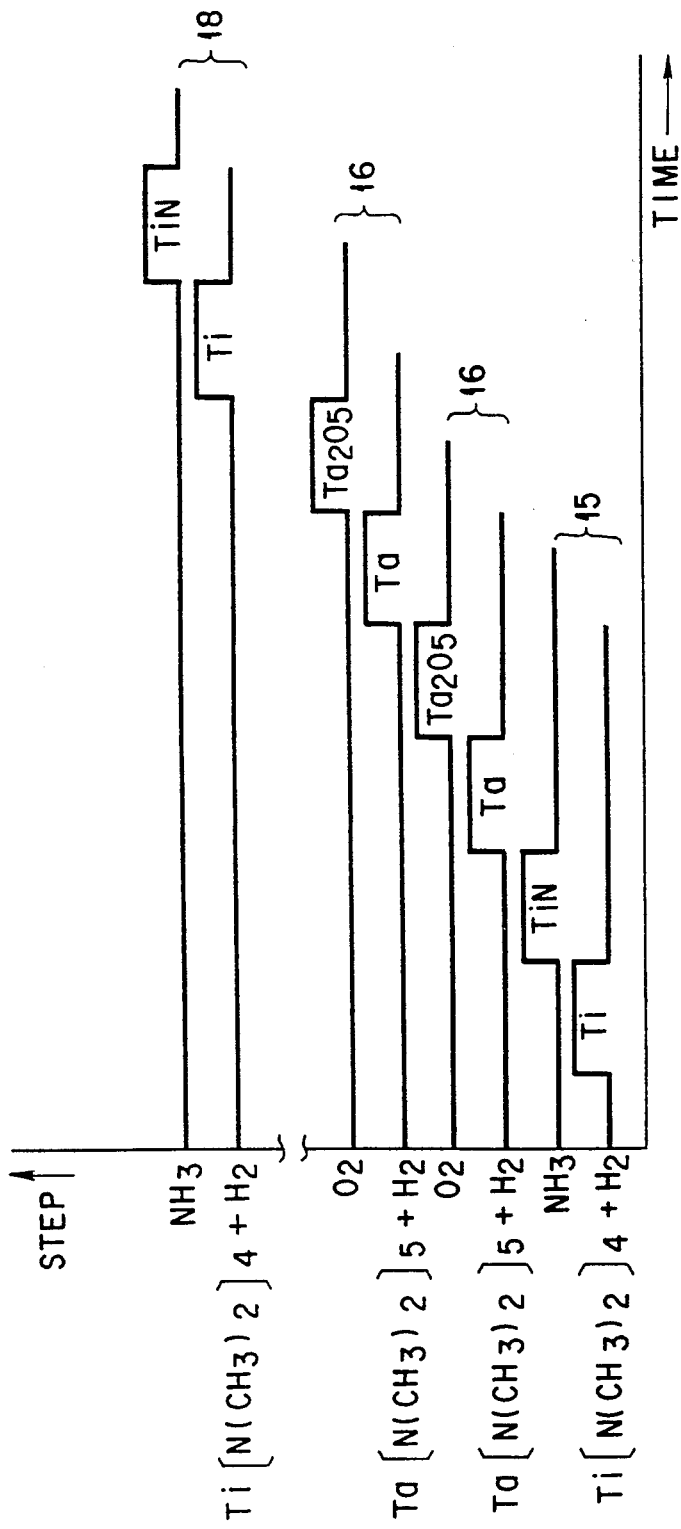

METHOD OF FORMING DIELECTRIC FILM FOR SEMICONDUCTOR DEVICES

BACKGROUND OF THE INVENTION

1. Field of the Invention

The present invention relates to a method of forming a dielectric film for a semiconductor device and, more particularly, it relates to a method of forming a laminated film which can be used as a dielectric film of a capacitor and which includes oxidized tantalum layers.

2. Description of the Related Art

Various new processes have been developed these days to make semiconductor devices higher in performance and more highly integrated. The capacitor forming process is one of them and it is deemed as being important.

The capacitance C of the parallel-plate capacitor can be expressed as follows:

$$C = e_0 \cdot e_r \cdot S/d$$

wherein $e_0$ represents the vacuum dielectric constant, $e_r$ the relative dielectric constant of the dielectric substance, S the area of the plate and d the film thickness of the dielectric substance.

In order to increase the capacitance of the capacitor, therefore, the film thickness of the dielectric substance may be reduced. In the case of the small capacitance semiconductor device such as 1 M DRAM now available, therefore, its capacitor capacitance which becomes smaller as the capacitor is made finer can be kept not reduced when its parallel-plate capacitor is made thin or the film thickness of its dielectric substance is decreased.

In the case of 4 or more Ms DRAMs, however, it has become impossible to make the memory cell thin, from a physical viewpoint, by using a laminated film of $SiO_2$ and $Si_3N_4$, which is now used as dielectric film, as it is. The reasons are as follows:

1) $SiO_2$ has a low relative dielectric constant of 3.8, and even if the laminated film is made thin, the capacitance thereof cannot be made large enough.

2) When the laminated film is made thinner than 50 Å, leak current is increased.

In order to increase the capacitance, therefore, it has been tried to increase the area (S) of the plate or surface area of the capacitor. In other words, the capacitor has been tried to have a three-dimensional structure. Early days when it was wanted that the surface area of the capacitor was made as large as possible, the capacitor of the trench type was studied. In the case of the capacitor of this type, however, its signal to noise ratio (or S/N ratio) is lowered by a film formed of oxidized silicon. Therefore, the capacitor having a structure of the stacked type has been used these days. In addition to forming the stacked capacitor, this stacked type structure has been applied to the trenched Si to form a capacitor of stacked and trenched structure.

As 16- and 64-M DRAMs are developed, the devices are made finer and their capacitors are made thinner. In the case of the 64-M DRAM, for example, it is believed that its capacitor size becomes 1.5 mm² and that its film thickness becomes smaller than 50 Å when calculated in terms of a oxide film thickness. In addition, it is asked that power consumed must be made as smaller as possible. Since signal charge capacity equals to a product obtained by multiplying electrostatic capacitance by operating voltage, the lowering of power source voltage must be corrected by increasing the electrostatic capacitance. In order to increase the surface area of the capacitor, therefore, capacitors of the fin, crown and chimney types have been proposed these days. It is however quite difficult to make these capacitors because their structures are complicated.

As means for solving this problem, attention has been again paid to those materials, which have a high dielectric constant, such as tantalum pentoxide ($Ta_2O_5$), and studies have been conducted to make them practical (see a monthly "Semiconductor World", March issue, 1987 and May issue, 1990: and "J. Electrochem., Soc.", Vol. 136, No. 3, March, 1989).

$Ta_2O_5$ is one of materials most worthy of attention because its relative dielectric constant is as high as 28. However, it is still impossible to form a film of fully satisfactory and high quality with this $Ta_2O_5$. Even if dielectric film is made using $Ta_2O_5$, therefore, its withstand voltage is still low. This is a problem to be conquered upon making $Ta_2O_5$ practical.

The reasons why a high quality film cannot be made using $Ta_2O_5$ are as follows:

1) $Ta_2O_5$ is likely to be reduced by Si which serves as base material. This makes oxygen atoms short, thereby causing the withstand voltage of the film thus formed to become low. When a little more added from the viewpoint of standard free energy of formation, $SiO_2 = -0.8244$ J/mol and $Ta_2O_5 = -1.191$ J/mol. O in $Ta_2O_5$ is therefore likely to be reduced by Si. Further, when CVD and sputtering manners are used, in which an organic Ta gas is mixed with an oxidizing gas for continuous deposition, a film thus formed is often short of oxygen, and the composition thereof deviates from the stoichiometric composition, because components reacted in vapor-phase are deposited. This leads to the lowering of dielectric constant.

2) When contaminants such as carbon are present in the film, they cause leak current, which lowers the withstand voltage of the film. Particularly a gas source of the organic Ta gas is decomposed in the plasma CVD process, for example, and carbon as an intermediate by-product is likely to be taken into the film and to remain there.

3) Even when deposition is to be made in grooves of high aspect ratio to increase capacitance, it cannot be made conformable (or uniform in holes and on inner walls severely stepped).

$Ta_2O_5$ is quite high in physical property for a strong dielectric memory as described above, the barrier by which it is prevented from becoming practical cannot be broken yet.

SUMMARY OF THE INVENTION

An object of the present invention is therefore to provide a method capable of forming a dielectric film without leaving almost any intermediate by-product not reacted in a $Ta_2O_5$ layer.

Another object of the present invention is to provide a method of forming a dielectric film having a composition close to the stoichiometric composition and including a $Ta_2O_5$ layer high in dielectric constant and excellent in withstand voltage.

According to the present invention, there can be provided a method of forming a dielectric film of a semiconductor device on a substrate while using the plasma CVD apparatus, comprising the steps of: keeping a process chamber, in which the substrate is housed, highly reduced in pressure while exhausting it, supplying a source gas of organic tantalum compound and hydrogen radicals into the process chamber through different inlets, and reacting both of them each other in the process chamber to uniformly deposit a tantalum layer on the substrate; and keeping the process chamber highly reduced in pressure while exhausting it and supplying oxygen radicals into the process chamber to oxidize the tantalum layer into a $Ta_2O_5$ layer; wherein the deposition of the tantalum layer and its oxidization are repeated to enable the dielectric film to have plural $Ta_2O_5$ layers.

According to the present invention, a tantalum organic compound which serves as source gas is reacted with hydrogen radicals. A thin tantalum layer including hydrocarbon radicals such as methyl and ethyl radicals can be thus uniformly deposited in deep grooves on a semiconductor wafer. Oxygen radicals are then reacted with the thin tantalum layer. Sufficient 0 atoms can be thus supplied to form the $Ta_2O_5$ film having a stoichiometric composition. The hydrocarbon radicals such as methyl and ethyl radicals can be oxidized by O atoms to be eliminated outside from the tantalum layer in the form of CO or $CO_2$ gas. The layer thus formed can be much less contaminated by carbon. When the step of forming the thin tantalum layer and the step of reacting oxygen radicals with the thin tantalum layer are repeated, a stoichiometric dielectric film, controllable in thickness, can be formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a time chart showing the process of forming the capacitor according to the second embodiment of the present invention.

DETAILED DESCRIPTION OF THE PREFERRED EMBODIMENTS

Figure 1:
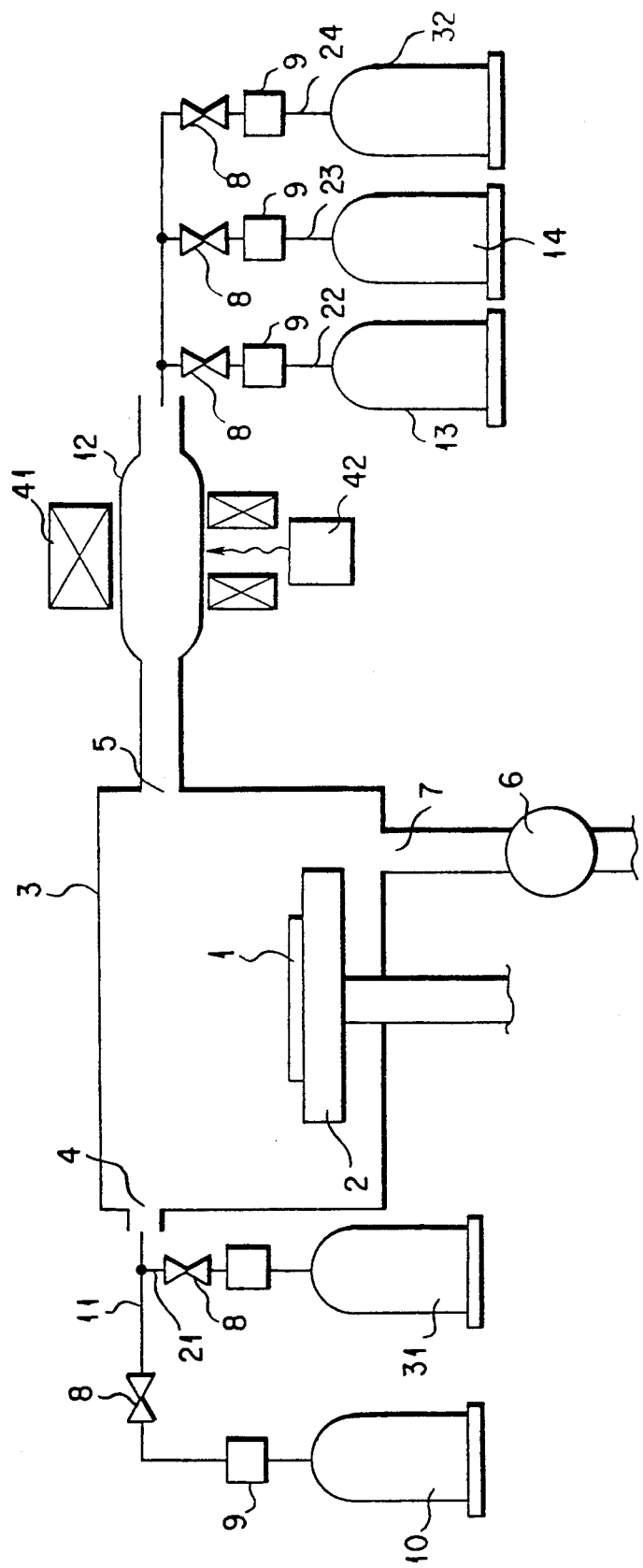
FIG. 1 schematically shows an example of the plasma CVD apparatus for carrying out a film forming method according to the present invention.

FIG. 1 schematically shows an example of the plasma CVD apparatus for carrying out a method of forming dielectric film according to the present invention.

The plasma CVD apparatus includes a process chamber 3 in which a semiconductor wafer 1 is mounted on a stage 2. The process chamber 3 has a source gas inlet 4 through which a source gas is supplied into the process chamber 3, and a reactive medium inlet 5 through which a reactive medium comprising hydrogen or oxygen radicals is supplied into the process chamber 3. The process chamber 3 also has an exhaust outlet 7 connected to a vacuum pump 6.

The process chamber 3 can be adjusted to have a vacuum of about $10^{-5}$ Torr, for example, by the vacuum pump 6.

The atmosphere in the process chamber 3 can be set at 300° C. In order to heat the atmosphere, heater coils are embedded in the stage 2. An infrared lamp may be provided at a position opposite to the wafer 1, instead of the heater coils.

A tantalum supply source 10, in which an organic tantalum compound such as pentadimethylaminotantalum $(Ta(N(CH_3)_2)_5)$ is contained, is connected to the source gas inlet 4 of the process chamber 3 through a pipe 11. This pipe 11 which extends to the tantalum supply source 10 includes a switch valve 8 and then a flow rate control valve 9.

Supply sources in which sub-source gases including zirconium (Zr), titanium (Ti) and silane ($SiH_4$), for example, are contained independent of the others are connected, parallel to one another, to the pipe 11 and then to the inlet 4 of the process chamber 3. Therefore, one or more of these sub-source gases can be selectively supplied into the process chamber 3 through the inlet 4. FIG. 1 shows only one sub-source gas pipe 21 and a tank 31. This sub-source gas pipe 21 also includes a switch valve 8 and a flow rate control valve 9.

Gases including tungsten (W), columbium (Nb), hafnium (Hf) and yttrium (Y) may be used as sub-source gases.

On the other hand, a plasma generating room 12 is connected to the reactive medium inlet 5 of the process chamber 3. Hydrogen, oxygen and ammonia gas supply sources 13, 14 and 32 are connected to the plasma generating room 12 through pipes 22, 23 and 24, respectively. Each of these pipes 22, 23 and 24 is provided with a switch valve 8 and a flow rate control valve 9. One or more of the hydrogen, oxygen and ammonia gases, therefore, can be selectively supplied into the plasma generating room 12.

A magnetic field coil 41 (875 gauss) encloses the plasma generating room 12. In addition, micro-wave (2.45 GHz) is applied to the plasma generating room 12 by a micro-wave supply member 42. The plasma generating room 12 is therefore constructed as an electron cyclone resonance (ECR) room. The gas which is supplied into the plasma generating room 12 is made plasma when microwave and magnetic field are applied to it. Electrons derived from the plasma of the gas are fed into the process chamber 3 by divergent magnetic field.

Figure 6:
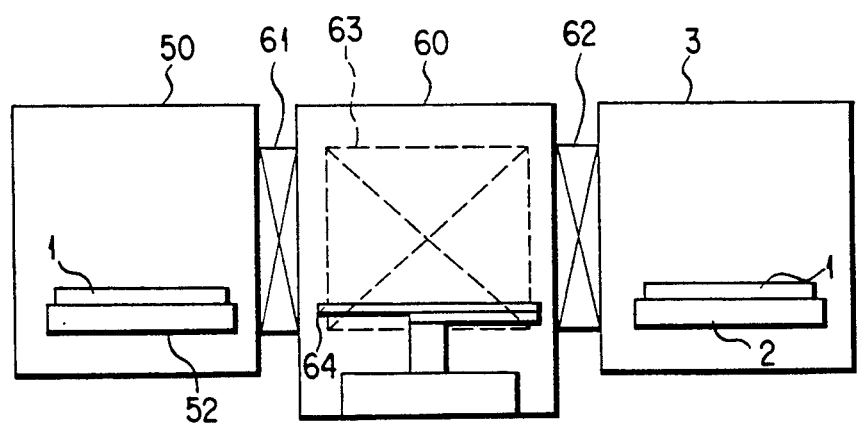
FIG. 6 schematically shows the plasma CVD apparatus shown in FIG. 1 and the cleaning chamber connected thereto.

As schematically shown in FIG. 6, a cleaning chamber 50 is connected to the process chamber through a load lock chamber 60. The cleaning chamber 50 is provided to remove a natural oxide film from the surface of the wafer 1.

Japanese Patent Application No. 1991-82984 filed by inventors of the present invention discloses a cleaning chamber which can be used as the cleaning chamber 50. According to this Patent Application, He gas is supplied into the cleaning chamber 50 which is kept highly reduced in pressure. Micro-wave and magnetic field are applied to the He gas thus supplied to create excited species which emit vacuum ultraviolet. The vacuum ultraviolet is radiated onto the surface of the wafer 1 held on a chuck 52 and the energy of this ultraviolet cuts bonds between Si atoms of the wafer 1 and 0 atoms forming the natural oxide film. Ar gas is also supplied into the cleaning chamber 50 and ionized by energy added from the excited species. These ions thus created are supplied onto the wafer surface to form their floating potential above the wafer surface. They collide against the wafer surface to eliminate 0 atoms therefrom.

Instead of the above-described process, a well known process of removing the natural oxide film from the wafer surface by use of a dilute HF treatment may be applied to the cleaning chamber 50. Or the above-described process of using the He gas excited species and the inactive gas may be used in the cleaning chamber 50 after the dilute HF treatment The load lock chamber 60 has a gate 61 at its side which faces the cleaning chamber 50, a gate 62 at its side which faces the process chamber 3, and a gate 63 at its side which faces outside atmosphere. A well-known handling member 64 is housed in the load lock chamber 60.

Figure 2:
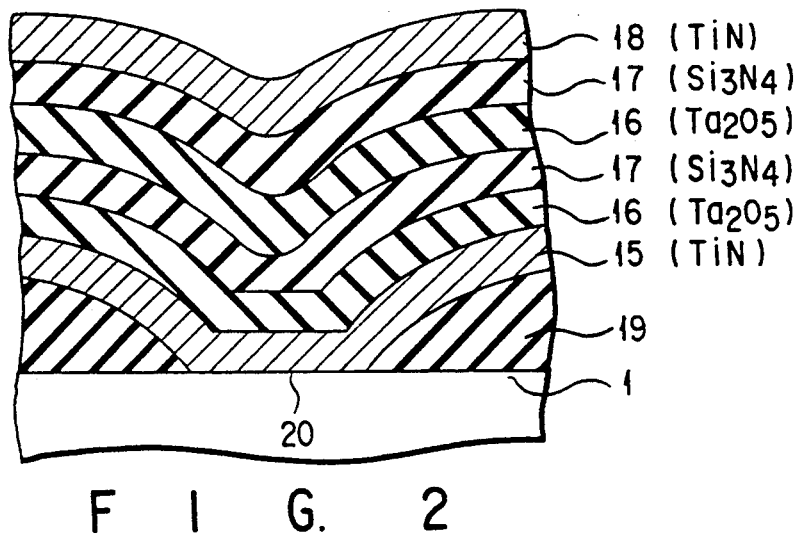
FIG. 2 is an enlarged sectional view showing a capacitor according to a first embodiment of the present invention.

FIG. 2 is an enlarged sectional view showing a capacitor according to a first embodiment of the present invention. An insulating film 19 is formed on the wafer or Si wafer 1 while leaving a contact region 20 thereon. A TiN layer 15 which serves as a lower electrode of the capacitor is then formed at the contact region 20 and on the insulating film 19. A $Ta_2O_5$ layer 16 and an $Si_3N_4$ layer 17 are alternately laminated on the TiN layer 15 to form a dielectric film. Another TiN layer 18 which serves as an upper electrode of the capacitor is further formed on the dielectric film.

It will be described in more detail how the capacitor is made according to the first embodiment of the present invention.

The wafer 1 is carried into the load lock chamber 60 through the gate 63. The internal pressure in the chamber 60 is adjusted and the wafer 1 is then mounted on the stage 52 in the cleaning chamber 50 by the handling member 64.

The cleaning chamber 50 is closed and its atmosphere is adjusted. The wafer 1 is then processed, as described above, using the He gas excited species and the inactive gas to remove the natural oxide film from the wafer surface at the contact region 20.

After the natural oxide film is removed in this manner, the wafer 1 is carried into the process chamber 3 through the load lock chamber 60. It is placed on the stage 2 and the process chamber 3 is closed, while exhausting the process chamber 3, it is set at $10^{-5}$ Torr and 300° C.

Figure 3:
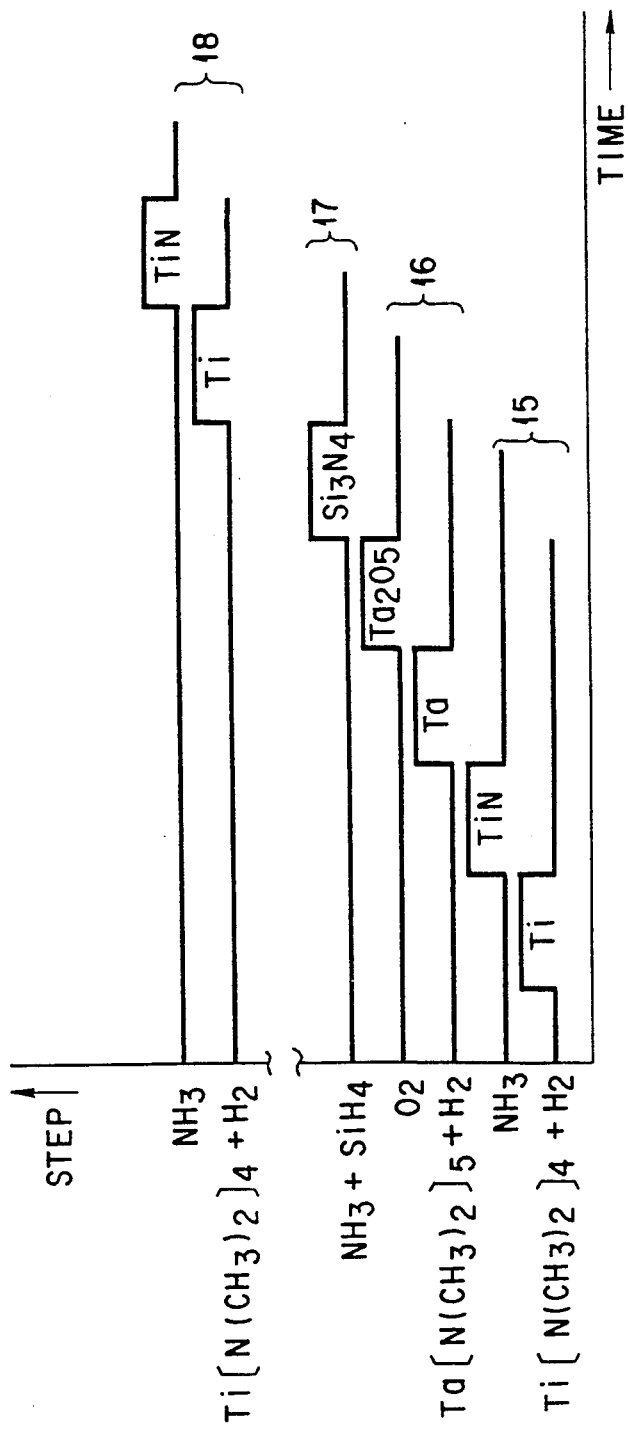
FIG. 3 is a time chart showing the process of forming the capacitor according to the first embodiment of the present invention.

As shown in a time chart in FIG. 3, $Ti(N(CH_3)_2)_4$ gas is supplied into the process chamber 3 through the inlet 4 while $H_2$ gas into it through the inlet 5. The internal pressure in the process chamber 3 is made 0.5 Torr. The $H_2$ gas thus supplied has been made plasma while passing through the plasma generating room 12 because the room 12 is arranged like the ECR system. Radacals are therefore supplied, as a down stream (in which ion species are bonded to electrons and changed neutral), into the process chamber 3. A Ti layer is deposited thin on the wafer 1 at the contact region 20 and on the insulating film 19 by the reaction of the two gases supplied.

$NH_3$ gas is then supplied into the process chamber 3 through the inlet 5 and the internal pressure in it is made 0.5 Torr. The $NH_3$ gas thus supplied has been made plasma, while passing through the plasma generating room 12, and supplied, as a down stream, into the process chamber 3. The thin Ti layer is thus nitrogenized to form the TiN layer which serves as the lower electrode 15 of the capacitor. The temperature of the wafer 1 is 100° C. at this time and the thickness of the lower electrode 15 is 100 Å.

An organic tantalum compound such as $Ta(N(DH_3)_2)_5$ is supplied into the process chamber 3 through the inlet 4 while $H_2$ gas into it through the inlet 5. The internal pressure in it is made $1 \times 10^{-3}$ Torr. The $H_2$ gas thus supplied has been made plasma, while passing through the plasma generating room 12, and radicals are therefore supplied, as a down stream, into the process chamber 3. A Ta layer is deposited thin on the Ti layer or lower electrode 15 by the reaction of the two gases supplied.

$O_2$ gas is supplied into the process chamber 3 through the inlet 5 and the internal pressure in it is made 1.0 Torr. The $O_2$ gas thus supplied has been made plasma, while passing through the plasma generating room 12, and radicals are therefore supplied, as a down stream, into the process chamber 3. The thin Ta layer is thus oxidized to form a thin tantalum oxide ($Ta_2O_5$) layer 16 which serves as the dielectric film. The $Ta_2O_5$ layer 16 has a thickness of 40 Å at this time.

$SiH_4$ gas is supplied into the process chamber 3 through the inlet 4 while $NH_3$ gas into it through the inlet 5. The internal pressure in it is made 1 Torr. The $NH_3$ gas thus supplied has been made plasma, while passing through the plasma generating room 12, and supplied, as a down stream, into the process chamber 3. A silicon nitride ($Si_3N_4$) layer 17 is thus deposited on the $Ta_2O_5$ layer 16 by the reaction of the two gases supplied. The thickness of the $Si_3N_4$ layer 17 is 10 Å at this time.

The forming of the $Ta_2O_5$ and $Si_3N_4$ layers is then repeated predetermined times or two times, for example, to create the laminated dielectric film of the $Ta_2O_5$ and $Si_3N_4$ layers. A strong dielectric capacitor cell can be thus formed. Further, the reduction of oxygen in the $Ta_2O_5$ layer 16 can be prevented by the TiN layer 15 and current can be stopped from leaking at the Si interface of the layer 16.

When the TiN layer 18 which serves as the upper electrode is formed in the same manner as the TiN layer 15 is, the capacitor can be finally finished.

The above-described film forming process is carried out in digital manner as shown in FIG. 3. Even if an intermediate by-product such as carbon not reacted yet is taken into the Ta layer, therefore, the carbon can be removed not to remain in the $Ta_2O_5$ layer by the subsequent oxidizing step. Namely, the $Ta_2O_5$ layer 16 can be formed, having a composition close to the stoichiometric composition. Therefore, a film high in dielectric constant and excellent in withstand voltage can be formed. In addition, the film can be formed to have a multi-layer structure consisting of the $Ta_2O_5$ and $Si_3N_4$ layers which are different in material, and this can prevent current leakage from being caused between the plural $Ta_2O_5$ layers.

It is arranged that the thickness of the single $Ta_2O_5$ layer 16 is less than 100 Å. When it is larger, carbon and others will become likely to remain in the layers and lower the dielectric constant of the layer 16.

It is also arranged that the thickness of the single $Si_3N_4$ layer 17 is less than 100 Å. When it is larger, the same thing can be said.

Metal oxides, high in dielectric constant, such as zirconium oxide, titanium oxide, tungsten oxide, niobium oxide, hafnium oxide and yttrium oxide can be used instead of $Si_3N_4$ as the dielectric layer 17 which is combined with the $Ta_2O_5$ layer 16. Further, tantalum nitride or tungsten nitride can be used instead of TiN as the upper and lower electrodes 15 and 18.

Figure 4:
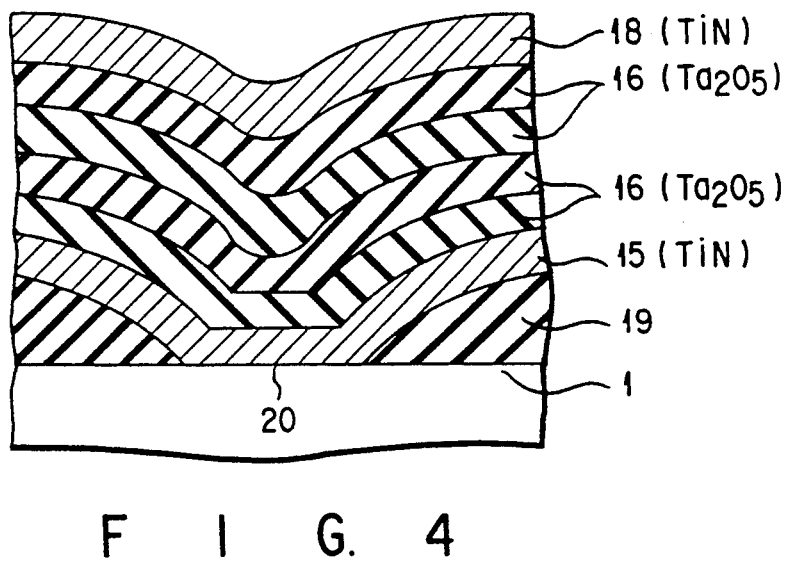
FIG. 4 is an enlarged sectional view showing a capacitor according to a second embodiment of the present invention.

FIG. 4 is an enlarged sectional view showing another capacitor according to a second embodiment of the present invention. The dielectric film which serves as the capacitor is formed by laminating the $Ta_2O_5$ layers 16 one upon the others. Different from the dielectric film according to the first embodiment, no $Si_3N_4$ layer is present between the $Ta_2O_5$ layers 16 in this case. The second dielectric film, however, is the same as the first one except this point.

The second capacitor is formed as shown in a time chart in FIG. 4. At first thin Ti layer is deposited on the wafer 1 at the contact region 20 and on the insulating layer 19 by using $Ti(N(CH_3)_2)_4$ and $H_2$ gases, for example, as in the first embodiment.

The thin Ti layer is nitrified by $NH_3$ gas to form the TiN layer 15, 100 Å thick.

A thin Ta layer is then deposited on the TiN layer 15 by using $Ta(N(CH_3)_2)_5$ and $H_2$ gases.

The thin Ta layer is then oxidized by $O_2$ gas to form another thin $Ta_2O_5$ layer 16, 40 Å thick.

The forming of these $Ta_2O_5$ layers 16 is repeated predetermined times to form a laminated dielectric film consisting of plural $Ta_2O_5$ layers. A strong dielectric capacitor cell can be thus formed.

Finally, another TiN layer 18 which serves as the upper electrode is formed in the same manner as the TiN layer 15 is. The capacitor can be thus finished.

The above-described film forming process is carried out in digital manner, as shown in FIG. 5. Even if an intermediate by-product such as carbon not reacted yet is taken into the Ta layer, therefore, the carbon can be removed not to remain in the $Ta_2O_5$ layers 16 by the subsequent oxidizing step. Namely, the $Ta_2O_5$ layer 16 can be formed, having a composition close to the stoichiometric one. The film, therefore, can have a high dielectric constant and excellent withstand voltage characteristics. In addition, the dielectric film can have a multi-layer structure consisting of plural laminated $Ta_2O_5$ layers. Even if any cause of current leakage is present in some $Ta_2O_5$ layer 16, therefore, the other $Ta_2O_5$ layers can block this cause. The possibility that any current leakage is caused in the dielectric film can be thus reduced to a greater extent.

It is arranged that the thickness of the single $Ta_2O_5$ layer 16 is less than 100 Å. When it is larger, carbon and others will remain in the layers and lower the dielectric constant of the layer 16.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a dielectric film of a semiconductor device on a substrate in a plasma CVD apparatus, comprising the steps of:

keeping a process chamber, in which the substrate is housed, at a greatly reduced pressure while exhausting the chamber, supplying a source gas of organic tantalum compound and hydrogen radicals into the process chamber through different inlets, and thermally reacting the organic titanium compound and hydrogen in the process chamber, thereby uniformly depositing a tantalum layer containing organic substances derived from the source gas of the organic tantalum compound on the substrate; and keeping the process chamber at greatly reduced pressure while exhausting it and supplying oxygen radicals into the process chamber to oxidize the tantalum layer to form a $Ta_2O_5$ layer as well as to oxidize and remove the organic substances therefrom;

wherein the deposition of the tantalum layer and its oxidation are repeated thereby enabling the preparation of a dielectric film having plural $Ta_2O_5$ layers.

2. The method according to claim 1, wherein the thickness of each of the $Ta_2O_5$ layers is less than 100 Å.

3. The method according to claim 1, which further comprises a step of forming an auxiliary dielectric of a dielectric material different from $Ta_2O_5$ after each step of forming a $Ta_2O_5$ layer so as to form a structure in which layers of $Ta_2O_5$ and the auxiliary dielectric alternate in a laminate.

4. The method according to claim 3, wherein the thickness of each of the $Ta_2O_5$ layers is less than 100 Å.

5. The method according to claim 4, wherein the thickness of each of the auxiliary dielectric layers is less than 100 Å.

6. The method according to claim 5, wherein the auxiliary dielectric layer consists of $Si_3N_4$.

7. The method according to claim 5, wherein the auxiliary dielectric layer is formed of a metal oxide selected from the group consisting of zirconium, titanium, tungsten, niobium, hafnium and yttrium oxides.

8. The method according to claim 1, wherein said substrate is made of silicon and which further comprises a step of forming a conductive layer on the substrate before the $Ta_2O_5$ layers are formed, which conductive layer prevents reduction of the $Ta_2O_5$ layers.

9. The method according to claim 8, wherein said conductive layer consists of a material selected from the group consisting of tantalum, titanium and tungsten nitrides.

10. The method according to claim 8, wherein said semiconductor device is a capacitor, said conductive layer serves as a lower electrode and another conductive layer which serves as an upper electrode is formed on the dielectric film after this film is formed.

11. The method according to claim 10, wherein said conductive layer as the lower electrode and the upper electrode as the upper electrode are formed of the same material.

12. The method according to claim 11, wherein said same material is TiN.

* * * * *